United States Patent [19]

Saito et al.

[11] Patent Number: 4,623,034

[45] Date of Patent: Nov. 18, 1986

[54] LOUDSPEAKER CONSTRUCTION

[75] Inventors: Hitoshi Saito; Hitoshi Hatori; Kazuyuki Matsubayashi, all of Kanagawa, Japan

[73] Assignee: Kabushiki Kaisha Toshiba, Kawasaki, Japan

[21] Appl. No.: 765,923

[22] Filed: Aug. 15, 1985

[30] Foreign Application Priority Data

Sep. 29, 1984 [JP] Japan .......................... 59-147488[U]

[51] Int. Cl.[4] .............................................. H05K 5/00

[52] U.S. Cl. .................................... 181/148; 181/171; 181/199

[58] Field of Search ............... 181/145, 148, 150, 151, 181/153, 199, 171; 179/146 R, 146 E; 312/7.1

[56] References Cited

U.S. PATENT DOCUMENTS 3,135,349 6/1964 Lahti .............................. 181/151 X
3,962,544 6/1976 Kobayashi ........................ 181/152 X
4,161,995 7/1979 Pohlmann et al. ............. 181/141 X
4,454,927 6/1984 Seebinger ....................... 181/150 X
4,546,850 10/1985 Litner ................................ 181/141

FOREIGN PATENT DOCUMENTS 321612 11/1929 United Kingdom .
1322078 7/1973 United Kingdom .
1336847 11/1973 United Kingdom .

*Primary Examiner*—Benjamin R. Fuller
*Attorney, Agent, or Firm*—Cushman, Darby & Cushman

[57] ABSTRACT

A loudspeaker structural arrangement enhancing frequency range and flatness of frequency response. The speaker enclosure has an aperture wall defining an aperture at a front portion of the enclosure. The aperture wall has an inclined inside surface sot that the aperture size varies as function of distance along an axis of the aperture. The speaker's transducer unit includes a frame having an outside surface that is inclined to generally match the inclinator of the aperture wall. So that the transducer can be force fit into the enclosure and pressed against it to firmly secure it without attachment to a flange of the transducer.

7 Claims, 3 Drawing Figures

LOUDSPEAKER CONSTRUCTION

BACKGROUND OF THE INVENTION

1. Field of the Invention

The present invention relates generally to loudspeakers. More particularly the invention provides a high fidelity loudspeaker structural arrangement for enhancing frequency range and flatness of frequency response.

2. Description of the Prior Art

The structure of a loudspeaker and the positional relationship between its transducer element, its baffles and enclosures and other mounting structures affect its frequency response and frequency range. In an effort to achieve wide range and flat response, many loudspeaker arrangements have been developed.

Usually, a transducer unit is mounted on a baffle of a speaker enclosure by fastening forward edges or flanges of the transducer unit to either an inside or outside surface of the baffle. The loudspeaker type wherein the transducer is mounted on the outside surface of the baffle is free from harmful cavity effects caused by a hollow cavity through which the transducer unit is mounted. Such loudspeakers, however, have a drawback that the transducer unit is not sufficiently firmly attached to the baffle because a flange of the transducer unit is relatively weak. This causes a harmfull vibration of the enclosures.

In loudspeakers of the type wherein the transducer unit is mounted to the inside surface of the baffles, the transducer units are easily attached to the baffles by means disclosed in U.S. Pat. No. 3,135,349 issued on June 2, 1964. The teachings of that patent are hereby incorporated into this patent as if fully set forth herein. The referenced patent proposes a structure wherein the forward edge of the transducer unit is pressed against the inside surface of a front wall of the speaker enclosure by means of a wooden plug, which extends through a rear wall of the enclosure and attaches the enclosure by pressing against a rear portion of a yoke of the transducer unit. The same structure is also disclosed in Japanese Utility Model Disclosure No. UM54-30927 opened in public on Feb. 28, 1979. In those arrangements, the transducer unit is mounted firmly in the enclosure to suppress harmful vibration of the enclosure. However, loudspeakers of this type are subject to the problem of the aforementioned cavity effect.

SUMMARY OF THE INVENTION

It is therefore the primary object of the present invention to provide a loudspeaker with a relatively flat frequency response over a wide frequency range.

It is another object of the present invention to provide a loudspeaker that is not subject to a cavity effect caused by a hollow cavity of baffle for mounting the transducer unit therethrough.

It is a further object of the present invention to provide a loudspeaker in which a transducer unit is mounted firmly to a baffle of an enclosure.

It is a still further object of the present invention to provide a loudspeaker with a transducer not having a flange portion for mounting to an enclosure.

According to the present invention, the loudspeaker includes an enclosure which has an aperture wall defining an aperture at a front portion of the enclosure. The aperture wall has a sloped inside surface so that the aperture varies in size along a central axis of the aperture. A transducer unit includes a frame having an outside wall that varies in size as a function of distance along an axis of the frame. The outside of the frame generally matches the inside of the aperture. The frame is "force" fit into the aperture. Means are provided for pressing the outside of the frame against the inside of the aperture.

Figure 1:
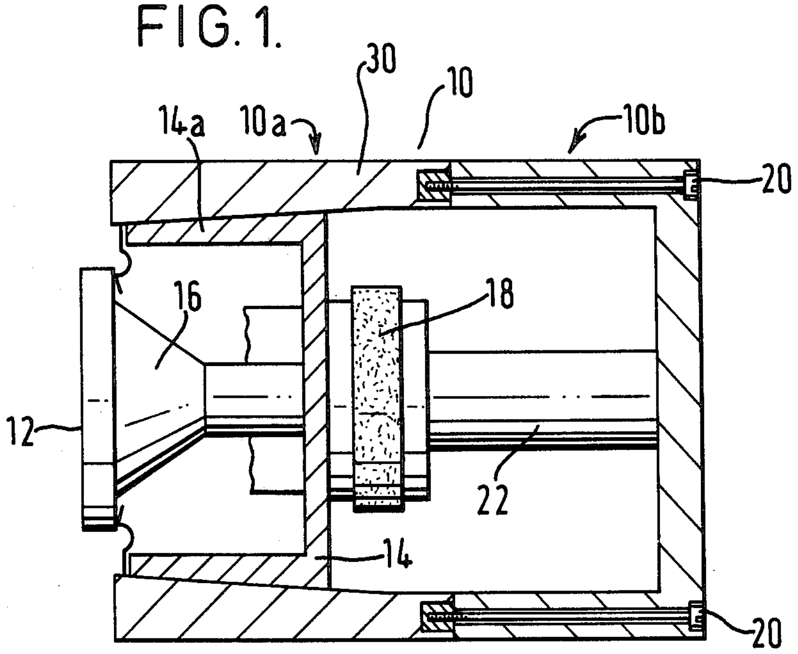
FIG. 1 is a sectional view of a first embodiment of a loudspeaker according to the present invention.

Additional objects, advantages, and features of the present invention will further become apparent to persons skilled in the art from a study of the following detailed description and of the accompanying drawings, in which:

DESCRIPTION OF THE PREFERRED EMBODIMENTS

The present invention will now be described in detail with reference to the accompanying drawings. Throughout the drawings, like reference numerals and letters are used to designate like, equivalent or corresponding elements for the sake of simplicity of explanation.

Referring now to FIG. 1, there is shown a first embodiment of a loudspeaker according to the present invention. An enclosure 10 has both a front portion **10*a* and a rear portion 10*b*. The front portion 10*a* is formed generally in a tube shape by an aperture wall 30. The inside surface of wall 30 is inclined so that the aperture varies in size as a function of distances along an axis of the aperture. As shown, the aperture narrows toward the front of the speaker. Rear portion 10*b*** has a cup shape.

Transducer unit 12 includes a frame 14, a diaphram 16, movably supported on the frame, and a driver 18 secured on the frame for driving the diaphram. Frame 14 has a tubular section **14*a* housing therein diaphram 16. The outside wall of tubular section 14*a* gradually becomes narrow with the same inclination as that of the inside surface of aperture wall 30**.

Transducer unit 12 is inserted into front portion **10*a* of the enclosure 10 from the end with a wider inside wall, i.e., from the rear end of the front portion 10*a*. Then, rear portion 10*b* of the enclosure 10 is secured to the rear end of the front portion 10*a* by means of fastening devices like screws 20. In addition, a pressing device such as a rod 22 is put between driver 18 of transducer unit 12 and rear portion 10*b* of the enclosure 10. Rod 22 presses the transducer unit 12 against the inside surface of aperture wall 30 of the front portion 10*a* of the enclosure 10. As a result, transducer unit 12 is securely fitted to the front portion 10*a* of the enclosure 10 and the front surface of diaphram 16 is generally aligned with the front end surface of the enclosure 10**.

Figure 2:
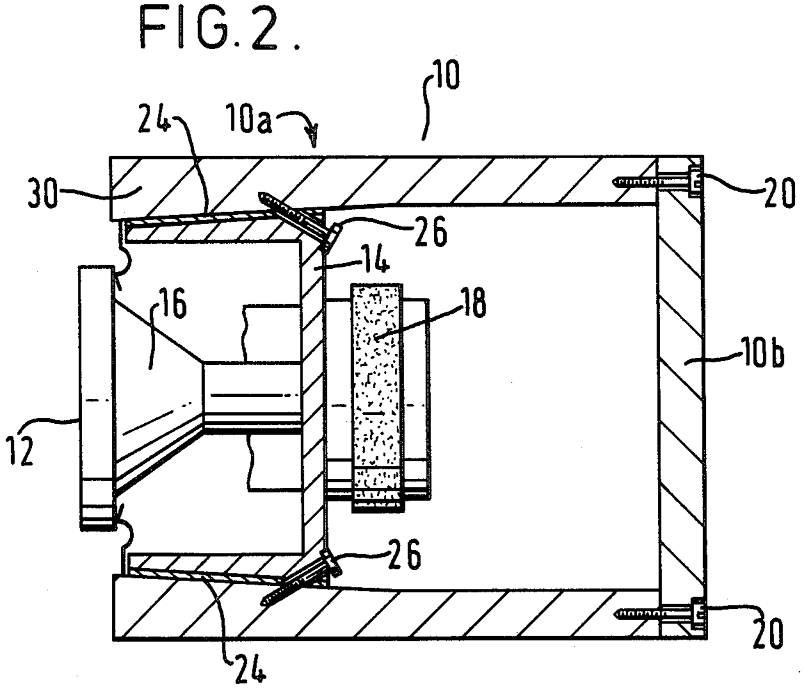
FIG. 2 is a sectional view of a second embodiment of the invention.

Referring now to FIG. 2, there is shown a second embodiment of the invention. A front portion **10*a* of enclosure 10 and transducer unit 12 are constructed in almost identical with the corresponding part shown in FIG. 1**.

Transducer unit 12 is inserted into the front portion **10*a* of the enclosure 10 from the end with a wider inside wall, i.e., the rear end of the front portion 10*a*. The outside surface of the frame 14 is attached to the inside wall of the front portion 10***a* of the enclosure 10 through a resilient buffer material 24 like rubber. Transducer unit 12 is pressed at its frame 14 against the inside wall of the front portion 10*a* of the enclosure 10 by means of fastening devices like screws 26. Then, a rear portion 10*b* of the enclosure 10 with a flat cover shape is secured to the rear end of the front portion 10*a* by means of screws 20. As a result, the loudspeaker unit 12 is mounted stiffly to the front portion 10*a* of the enclosure 10 and the forefront of the diaphram 16 is aligned about to the front surface of the enclosure 10.

Figure 3:
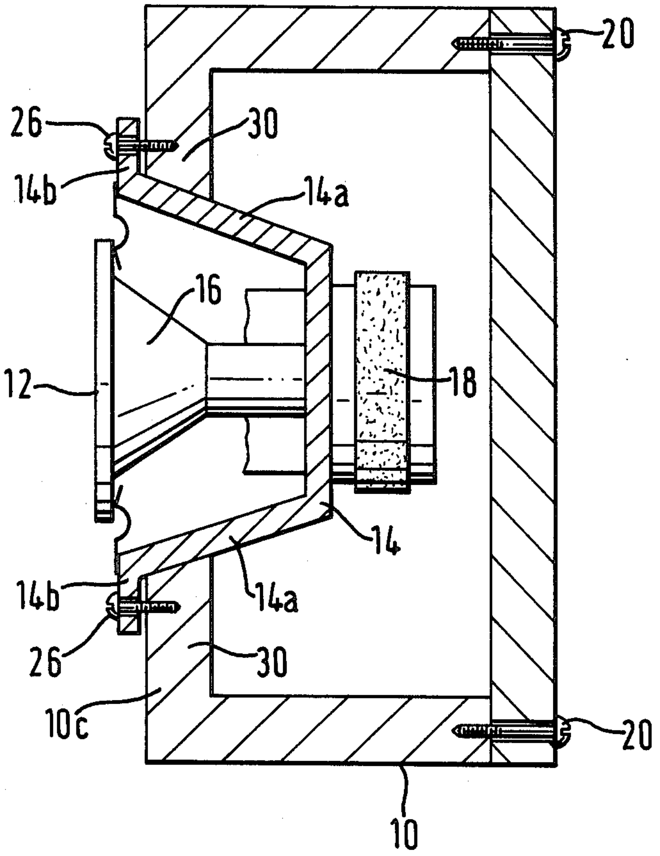
FIG. 3 is a sectional view of a third embodiment of the invention.

Referring now to FIG. 3, there is shown a third embodiment of the present invention. An enclosure 10 is formed in a box shape. Enclosure 10 has a baffle 10*c* in its front end. The baffle 10*c* defines an aperture. Aperture wall 30 of the baffle 10*c*, defining the aperture, gradually becomes narrow in the direction front to rear of enclosure 10.

Transducer unit 12 includes a frame 14, a diaphram 16 moveably supported on frame 14 and a driver 18 secured on the frame 14 for driving the diaphram 16. Frame 14 includes a tubular section 14*a* housing the diaphram 16 therein and a flange section 14*b* on the forefront of the tubular section 14*a*. The outside wall of the tubular section 14*a* gradually becomes narrow with the same inclination as the inside wall of the baffle 10*c* towards the driver 18 of transducer unit 12.

Transducer unit 12 is inserted into the enclosure 10 through the aperture of the baffle 10*c* from the front of the baffle 10*c* so that the outside wall of the tubular section 14*a* of frame 14 is attached to the inside wall of the baffle 10*c*. Then, the tubular section 14*a* in pressed against aperture wall 30 of the baffle 10*c* by means of fastening devices like screws 26. Screws 26 are anchored to the baffle 10*c* through holes defined in the flange section 14*b* of the frame 14. As a result, transducer unit 12 is firmly secured to baffle 10*c* of the enclosure 10 and the forefront of transducer unit 12, i.e., the forefront of the diaphram 16 is aligned about to the front surface of the baffle 10*c*.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. A loudspeaker comprising:

an enclosure having a wall defining an aperture which aperture varies in size as a function of distance along an axis of said aperture;

a transducer unit having a frame whose outside size varies as a function of distance along an axis of said transducer unit, said variation being opposite and equal to the variation in said aperture such that said transducer may be smoothly and securely fitted within said aperture; and means for pressing the outside of said transducer unit against said aperture wall.

2. A loudspeaker according to claim 1, wherein the aperture narrows in a first direction from a rear portion of said enclosure to a front portion thereof and said transducer unit is pressed at its frame against the aperture wall in said first direction.

3. A loudspeaker according to claim 2, wherein said pressing means is a rod put between said transducer unit and said rear portion of said enclosure.

4. A loudspeaker according to claim 2, wherein said pressing means comprises means for fastening said frame to said aperture wall.

5. A loudspeaker according to claim 1, wherein the aperture narrows in a second direction from a front portion to a rear portion thereof and said transducer unit is pressed at its frame against the aperture wall in said second direction.

6. A loudspeaker according to claim 5, wherein said frame has a flange portion and wherein said pressing means comprises means for fastening said flange portion to said enclosure.

7. A loudspeaker according to claim 1, further comprising a resilient buffer material between said frame and said aperture wall.

* * * * *